(12) United States Patent
Fluegel et al.

(10) Patent No.: US 8,829,957 B1
(45) Date of Patent: Sep. 9, 2014

(54) METHOD OF DISTRIBUTING A CLOCK SIGNAL, A CLOCK DISTRIBUTING SYSTEM AND AN ELECTRONIC SYSTEM COMPRISING A CLOCK DISTRIBUTING SYSTEM

(71) Applicant: PRO DESIGN Electronic GmbH, Bruckmuehl (DE)

(72) Inventors: Sebastian Fluegel, Ottobrunn (DE); Dragan Dukaric, Bruckmuehl (DE)

(73) Assignee: PRO DESIGN Electronic GmbH, Bruckmuehl (DE)

( * ) Notice: Subject to any disclaimer, the term of this patent is extended or adjusted under 35 U.S.C. 154(b) by 0 days.

(21) Appl. No.: 13/853,832

(22) Filed: Mar. 29, 2013

(30) Foreign Application Priority Data

Mar. 8, 2013 (EP) ..................... 13158402

(51) Int. Cl.
*H03L 7/06* (2006.01)
*H04J 3/06* (2006.01)

(52) U.S. Cl.
CPC .................... *H04J 3/0682* (2013.01)
USPC ............ 327/146; 327/153; 327/160; 327/161

(58) Field of Classification Search
CPC ........ G06F 1/10; H04L 7/0008; H04J 3/0682; H04J 3/0688
USPC .......... 375/373, 376; 327/146, 141, 144, 147, 327/149, 150, 151, 152, 153, 155, 156, 158, 327/159, 160, 161, 162
See application file for complete search history.

(56) References Cited

U.S. PATENT DOCUMENTS

| | | | | |
|---|---|---|---|---|
| 5,220,660 | A | * | 6/1993 | Yoshizawa et al. ........... 713/375 |
| 5,239,562 | A | * | 8/1993 | Grimes ........................ 375/358 |
| 5,347,227 | A | | 9/1994 | Bortolini |
| 6,993,314 | B2 | * | 1/2006 | Lim et al. ...................... 455/333 |
| 2007/0067660 | A1 | | 3/2007 | Morein et al. |

FOREIGN PATENT DOCUMENTS

| | | |
|---|---|---|
| EP | 0601777 A1 | 6/1994 |
| GB | 2129634 A | 5/1984 |
| WO | 2004111596 A2 | 12/2004 |

OTHER PUBLICATIONS

The extended European search report issued on Jul. 23, 2013, which corresponds to European Patent Application No. 13158402.1-1851 and is related to U.S. Appl. No. 13/853,832.

\* cited by examiner

*Primary Examiner* — Lincoln Donovan
*Assistant Examiner* — Jung H Kim
(74) *Attorney, Agent, or Firm* — Studebaker & Brackett PC (57) ABSTRACT

A clock signal from a first electronic subsystem is distributed to a second electronic subsystem. The second electronic subsystem is remote from the first electronic subsystem and coupled to the first electronic subsystem by a bidirectional signal path. A first clock signal is generated on the first electronic subsystem and a training signal is generated on the first electronic subsystem clocked by the first clock signal. The training signal is sent on the bidirectional signal path on a round trip to the second electronic subsystem and back to the first electronic subsystem. A phase of the training signal is adjusted symmetrically on the way to the second electronic subsystem in a first phase adjuster and on the way back to the first electronic subsystem in a second phase adjuster until the measured time for the round trip is equal to an even number of clock cycles.

15 Claims, 7 Drawing Sheets

METHOD OF DISTRIBUTING A CLOCK SIGNAL, A CLOCK DISTRIBUTING SYSTEM AND AN ELECTRONIC SYSTEM COMPRISING A CLOCK DISTRIBUTING SYSTEM

TECHNICAL FIELD

The present invention relates to a method of distributing a clock signal in a first electronic subsystem and a second electronic subsystem. The second electronic subsystem is remote from the first electronic subsystem. The invention further relates to a clock distributing system with a clock generator for generating a clock signal to be distributed. The clock generator is located in the first electronic subsystem. The invention further describes an electronic system with two electronic subsystems and a clock distributing system.

BACKGROUND

Digital signal processing systems and more especially large digital signal processing systems may be divided into several electronic subsystems. The electronic subsystems may be implemented or realized on different circuits boards. They may comprise several field programmable gate arrays (FPGA). The electronic subsystems may be remote from each other. Data are transmitted between the electronic subsystems for example by cables or interconnect boards. Other interconnection means for data transmission are also possible, for example radio interfaces or optical transmission lines.

A digital signal processing system or more generally an electronic system may support multiple clock domains. A clock domain consists of all sequential elements for example registers driven by that clock and all logic elements processing directly or indirectly signals from registers of that clock domain. Each clock domain may span over multiple electronic subsystems of the digital signal processing system. An electronic subsystem may include one unique clock domain or several clock domains.

Figure 1:
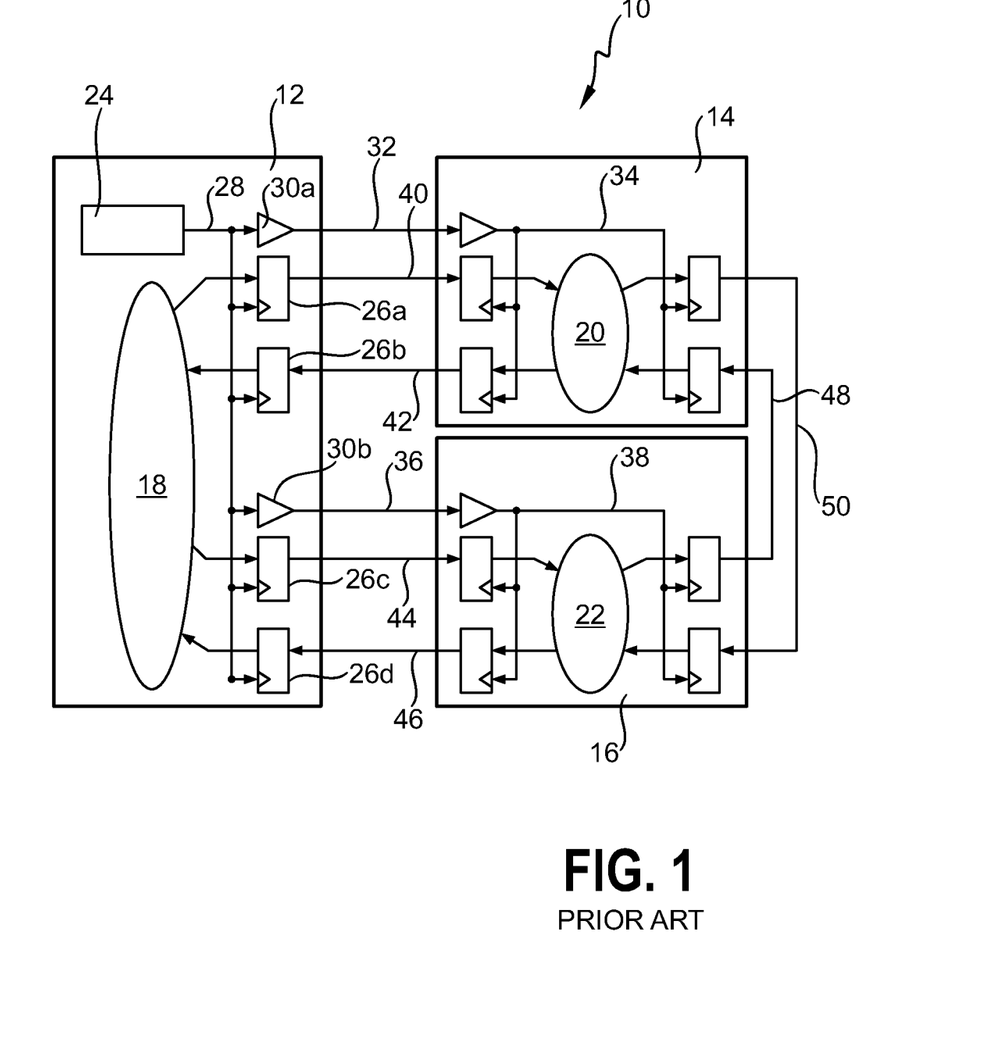
FIG. 1 shows a prior art electronic system with three subsystems.

FIG. 1 shows an exemplary electronic system 10 which is a digital signal processing system comprising a first electronic subsystem 12, a second electronic subsystem 14, and a third electronic subsystem 16. Each subsystem 12, 14 and 16 may be implemented on a different circuit board. The first subsystem 12 comprises internal logic 18, second subsystem 14 comprises internal logic 20 and third subsystem 16 comprises internal logic 22. The internal logics 18, 20 and 22 are adapted to produce a desired function of the electronic system 10 and comprise for example FPGAs.

The first subsystem 12 comprises a clock generator 24 and four flip flops 26a, 26b, 26c and 26d which are coupled to clock generator 24 via a clock line 28. Flip flops 26a, 26b, 26c and 26d are further coupled to internal logic 18. The first subsystem 12 further comprises two buffers 30a, 30b. Second and third subsystems 14 and 16 also comprise flip flops and a buffer each.

A first buffer 30a is coupled via a clock transmission line 32 to the buffer of the second subsystem 14 which is coupled with an output to a clock line 34. The buffer 30b is coupled via a clock transmission line 36 to the buffer of the third subsystem 16 which is coupled to a clock line 38.

Flip flop 26a is coupled with an output via a data transmission line 40 to second subsystem 14, and flip flop 26b is coupled with an output via a data transmission line 42 to second subsystem 14. Flip flop 26c is coupled with an output via a data transmission line 44 to third subsystem 16, and flip flop 42 is coupled with an output via a data transmission line 46 to third subsystem 16.

Data transmission lines 48 and 50 couple the second and the third subsystem with each other to exchange data between the second subsystem 14 and the third subsystem 16.

In operation, clock generator 24 generates a clock signal which is distributed throughout the first subsystem 12 via clock line 28. The clock signal is transmitted to second subsystem 14 via buffer 30a and clock line 32 and distributed throughout second subsystem 14 via clock line 34. The clock signal is further transmitted to third subsystem 16 via buffer 30b and clock line 36 and distributed throughout third subsystem 16 via clock line 38.

First subsystem 12 sends data from the internal logic 18 via flip flop 26a, data transmission line 40 and a flip flop in second subsystem 14 to the internal logic 20 of second subsystem 14. First subsystem 12 receives data from the internal logic 20 via data transmission line 42. Similarly, first subsystem 12 exchanges data with third subsystem 16 via flip flop 26c, data transmission line 44, data transmission line 46 and flip flop 26d. Second and third subsystems 14 and 16 exchange data via data transmission lines 48 and 50 and corresponding flip flops. All flip flops in all subsystems 12, 14 and 16 are clocked by the clock signal generated by clock generator 24. Internal logics 18, 20 and 22 are also clocked by the same clock signal.

The prior art digital signal processing system 10 as shown in FIG. 1 thus distributes the clock signal generated in subsystem 12 over the whole system 10. Three problems arise with such a clock distributing system.

Firstly, data signals travelling from the first subsystem 12 on data transmission line 40 to the second subsystem 14 race against the clock signal travelling on the clock transmission line 32 in the same direction, i.e. from the first subsystem 12 to the second subsystem 14. If the data transmission is slower, data will arrive after the clock edge. It can then be processed in the receiving subsystem 14 and the result is stored in the target register at the succeeding clock edge. This is what the digital circuit designer intends. However, the data signal may also win the race against the clock signal. In this case it may be stored in the target register virtually at the same clock edge as it has been generated. This is a design error and may lead to a faulty function of the digital signal processing system 10.

Secondly, due to the travel delay of the clock signal, registers in the second subsystem 14 and the third subsystem 16 operate later than registers in the first subsystem 12. Signals which are sent from registers in the second subsystem 14, i.e. comprised in the internal logic 20, to the first subsystem 12, have about the same travel delay. As a result, registers in the first subsystem 12 see twice the delay, i.e. the delay of the clock travelling from the first subsystem 12 to the second subsystem 14 and the delay of the data travelling from the second subsystem 14 to the first subsystem 12. This significantly reduces the possible clock frequency.

Thirdly, for data signals travelling on the data transmission lines 48 and 50 between the second subsystem 14 and the third subsystem 16, there is no safe timing assumption possible. Faulty processing may occur.

As a result, in the prior art each signal must be treated individually with care during the design process which enormously increases the design effort.

To avoid the before mentioned problems, modern digital signal processing systems use clock synthesis techniques to generate the same clock on all subsystems. The challenge of this approach is to ensure that all individually generated clocks have the same frequency and the same phase.

It is therefore an object of the present invention to provide a method of distributing a clock signal in a first electronic subsystem and a second electronic subsystem ascertaining that a same clock signal having the same frequency and the same phase is distributed all over the system.

It is further an object of the invention to provide a clock distributing system and an electronic system comprising a clock distributing system.

BRIEF SUMMARY OF THE INVENTION

The object is achieved by a method of distributing a clock signal from a first electronic subsystem to a second electronic subsystem, the second electronic subsystem being remote from the first electronic subsystem and coupled to the first electronic subsystem by a bidirectional signal path. The method comprises a learning period prior to normal operation. The learning period comprises the following steps. A first clock signal is generated on the first electronic subsystem and a training signal is generated on the first electronic subsystem clocked by the first clock signal. The training signal is sent on the bidirectional signal path on a round trip to the second electronic subsystem and back to the first electronic subsystem. The time the training signal needs for the round trip is measured. A phase of the training signal is adjusted symmetrically on the way to the second electronic subsystem in a first phase adjuster and on the way back to the first electronic subsystem in a second phase adjuster until the measured time for the round trip is equal to an even number of clock cycles.

The method may comprise a learning period and a normal operation mode. In the learning period a first clock signal is generated on a first electronic subsystem. The first clock signal is to be distributed to a remote second electronic subsystem via a bidirectional signal path.

The bidirectional signal path may be formed by wires, optical transmission lines or other communication lines. The bidirectional signal path is adapted to transmit a clock signal as well as a training signal in parallel and in both directions. The bidirectional signal path thus includes a clock line as discussed for the prior art.

A training signal may be generated on the first electronic subsystem clocked by the first clock signal. The training signal is a digital signal comprising at least one rising or falling edge between two different states, for example a "low" state and a "high" state. During the learning period, the training signal is a kind of training pulse used to train the clock distributing system to distribute the clock to have the same phase in the remote second electronic subsystem. During normal operation, the bidirectional signal path may transmit for example a reset signal or synchronization signal instead of the training signal.

The training signal is then sent on the bidirectional signal path to the second electronic system and back to the first electronic system on a round trip. The bidirectional signal path is symmetrical, delaying any signal in any direction in the same way.

The learning period further comprises measuring a time the training signal needs for a round trip. A phase of the training signal is adjusted so that the time needed for a round trip is equal to an even number of clock cycles.

The phase of the training signal is adjusted symmetrically in a first phase adjuster and in a second phase adjuster. The first phase adjuster adjusts the phase on the way to the second electronic subsystem, and the second phase adjuster adjusts the phase on the way back to the first electronic subsystem by the same amount than the first phase adjuster.

A phase adjuster adjusts a phase of a signal by adding a delay as known in the prior art. The phase adjusters may be realized as phase locked loops (PLLs).

The phase delay to be added may be calculated out of the measured time for the round trip and the cycle length.

Advantageously, the phase adjustment setting in the first phase adjuster is maintained during normal operation for distributing the first clock signal to the second electronic subsystem.

The principal idea of the invention is that a time delay in the bidirectional signal path is compensated by adding an additional delay in such a way that the clock signals used in both subsystems are in phase although they may differ by an integral number of clock cycles. In the learning period prior to normal use of the system the additional delay is determined by feeding back the training signal.

Thereby, the time for a round trip is measured. In normal operation, however, the clock is distributed one way, i.e. only in one direction. Therefore, the phase of the training signal is adapted to have a round trip time of an even number of clock cycles 2*N, where N is an integer. As the bidirectional signal path is symmetric, a time needed for one way is half of the time needed for the round trip, i.e. N clock cycles. To maintain the symmetry of the bidirectional signal path, the phase delay is also added symmetrically in both directions in two phase adapters.

The clock duplication process, i.e. the learning period may be performed during system initialization. When done, the hardware and in particular the subsystem interconnect signals for synchronization or the path for the training signals may be used otherwise for example for a synchronization signal used in both subsystems.

In another aspect, an inventive method of distributing a clock signal between a source system and a remote system comprises determining a clock delay between the two systems and adjusting digitally a phase of the clock in response to the determined clock delay by adjusting a phase of the clock signal on the source system and on the remote system.

The phase is not only adjusted in one of the two systems but in the two systems symmetrically. The symmetrical adjustment of the phase provides the possibility to have also a symmetrical use. A symmetrical use means that a clock signal may be generated in either of the two systems and distributed to the other system leading to clock signals on both systems having the same phase.

An inventive clock distributing system may comprise a switch to change between a learning period setting and a normal operation setting. A learning period setting is a setting in which the system is configured to train for a phase delay which allows distributing of a clock signal from a first electronic subsystem to a second electronic subsystem having the same phase in both subsystems.

The clock distributing system further comprises a clock generator which is located in the first electronic subsystem for generating a first clock signal. A training signal generator is located in the first electronic subsystem for generating a training signal clocked by the first clock signal. The meaning of a training signal is explained above. A bidirectional signal path is adapted to transmit the first clock signal and the training signal between the first electronic subsystem and the remote second subsystem in both directions as a master beat together.

A measurement unit is adapted to measure a time needed for the training signal to go to the remote second electronic subsystem and back to the first electronic subsystem in a round trip. As the training signal comprises a transition between two states, the transition can easily be detected.

A first phase adjuster and a second phase adjuster are configured to adjust symmetrically a phase of the training signal on the way to the second electronic subsystem and on the way back to the first electronic subsystem. The phase is adjusted to have a time needed for the round trip which is equal to an even number of clock cycles.

Advantageously, the first phase adjuster and the second phase adjuster are further adapted to maintain the adjusted phase during normal operation.

As the bidirectional signal path is adapted to transmit both, the clock signal and the training signal, the phase adjuster setting will also influence the clock signal. Consequently, the phase of the clock signal is adjusted so that the clock signals have the same phase on the first and the second subsystem.

An electronic system, for example a large configurable digital signal processing system with at least two electronic subsystems comprises a clock distributing system as described above.

Particular advantages, embodiments and features of the invention are given by the dependent claims, as revealed in the following description. Features of different claim categories may be combined as appropriate to give further embodiments not described herein.

In an embodiment, the learning period of the method further comprises sending a sequence of a plurality of training signals on the bidirectional signal path to the remote second subsystem and back to the first subsystem. The phase is adjusted incrementally until some of the training signals out of the sequence of training signals have a travel time of 2*N−1 cycles and some of the training signals have a travel time of 2*N cycles. N is an integral number. Using a sequence of training signals facilitates detecting the edge of the training signals and allows determining the time in an iterative process. Several iteration algorithms are possible, for example a step by step increment, a divide and conquer and so on.

If some of the training signals have a measured travel time of 2*N−1 cycles and some of the training signals have a measured travel time of 2*N cycles, the edge of the training signal occurs more or less exactly at the same time as an edge of the first clock signal, indicating that the travel time is a multiple of a clock cycle.

The embodiment may further comprise analyzing a statistical variation between a travel time of 2*N cycles and of 2*N−1 cycles. The phase delay is then set to have a maximal statistical variation. The maximal statistical variation is detected when about half of the training signals have a travel time of 2*N cycles and the other half of the training signals have a travel time of 2*N−1 cycles. Thus, the statistical information can be used to further refine the measurement by maximizing the sampling variation. It should be understood that a counter used for measuring the time only counts in full cycles, i.e. upon detection of a signal transition.

In a further embodiment, the first clock signal is transmitted during the learning period parallel to the training signal on the bidirectional signal path to the second electronic subsystem. The transmitted first clock signal is used in the second electronic subsystem to sample the training signal in the second electronic subsystem. The first clock signal is delayed together with the training signal in the first phase adjuster so that the first clock signal has the same phase delay as the training signal.

When the training signal is sampled in the second electronic subsystem with a clock edge opposite to the clock edge used to clock the training signal when generating it in the first electronic subsystem, a clear recognition is possible. Thus, during the learning period, the training signal is driven by a training signal generator in the source subsystem or first electronic subsystem and sampled at the target subsystem or second electronic subsystem with the received transmitted first clock signal. The phase adjusted clock may also be retransmitted to the source subsystem.

In a further embodiment, an information about the amount of phase adjustment is transmitted digitally between the two phase adjusters. Phase adjusting may be done by a phase locked loop (PLL) in each of the subsystems.

In the learning period first the local and the remote PLL are initialized by setting the phase to 0 degree. Once the PLLs have locked, the training signal generator in the source subsystem is started and the number of clock cycles the training signal needs to arrive to the phase detector is measured. The PLL phase is adjusted in both systems and a new training signal is sent and the number of clock cycles the training signal needs for the round trip is measured. These steps are repeated until the best delay setting is reached. The phase adjusters (PLLs) are adjusted symmetrically, whereby the amount of phase delay is transmitted digitally between the local and the remote PLL.

In an embodiment of the learning period, sampling of the returned training signal in the first electronic subsystem uses a same edge of the first clock signal as used when generating the training signal. The second electronic subsystem may return the training signal to the first electronic subsystem using separate wires of the bidirectional signal path. This way, the original first clock signal generated in the first subsystem provides a time base for the measurement.

An eye diagram is known to the person skilled in the art and obtained by overlaying a plurality of digital signals on an oscilloscope. In the embodiment described above, the effect in the eye diagram is as follows. When the addition of signal travel delay between the subsystems and the phase adjustments comprises a multiple of the clock period or clock cycle, the returned training signal will change its value simultaneously with the sampling edge of the original clock inside the first electronic subsystem. In the eye diagram, this is the position where the eye is shut. This is known as the position of the maximum sampling variation. It can be measured by counting the clock cycles for a round trip of the training signal. The characteristic behavior of the described embodiment is that the optimum phase adjustment results in the maximum variation of the training signal round trip time.

In an embodiment, during normal operation, the bidirectional signal path is used for transmitting a synchronization signal associated to the first clock signal to broadcast system synchronization events. It is to be understood, that the reset signal may be generated by another signal generator than the training signal used during the learning period as training pulse. However, the training signal is transmitted on the same transmission path, i.e. the bidirectional signal path, as the synchronization signal or reset signal.

During normal operation, the synchronization signal may transport digital synchronous information which is provided by the source subsystem on the rising or falling edge of the transmitted clock and sampled by the target subsystem on the opposite edge, providing a safe data transfer. The two signals clock and synchronization or clock and training are transmitted and processed in parallel so that they can be called a "master beat".

In an embodiment, a second clock signal is generated on the second electronic subsystem. During normal operation, the first clock signal may be distributed via the bidirectional signal path to the second electronic subsystem and/or the second clock signal may be distributed via the bidirectional signal path to the first electronic subsystem. The phase adjustment set during one unique learning period is sufficient for the two clock distributing directions. The phase adjustment effectuated in the first phase adjuster adjusts the phase of the first clock signal and the phase adjustment effectuated in the second phase adjuster adjusts the phase of the second clock signal.

In an embodiment of the clock distributing system, a second phase adjuster is located in the second electronic subsystem and the first phase adjuster is located in the first electronic subsystem. The first phase adjuster and the second phase adjuster are coupled to each other to transmit a phase adjustment message. According to the measured time, a phase of the clock signal is adjusted on the first electronic subsystem as well as on the second subsystem. As the two phase adjusters are coupled, a symmetrical phase adjustment may be set.

In a further embodiment, the measurement unit comprises a counter which is adapted to count a number of clock cycles. The count starts with the generation of the training signal and ends when the returned training signal is detected.

In a further embodiment, the clock distributing system comprises a control unit which is adapted to control the first phase adjuster and the second phase adjuster. The control unit may be located in the electronic system itself or may be remote.

In an embodiment, an electronic system which comprises an inventive clock distributing system and at least two electronic subsystems further comprises at least two clock distributing systems. Thus, each one of the two electronic subsystems can function as a source system with a clock generator generating a clock signal which is distributed to the other one of the two electronic subsystems. Each electronic subsystem comprises a switch for selecting one out of the two clock signals, i.e. the clock signal generated on the subsystem itself and the clock signal generated on the other one of the two subsystems and distributed to the subsystem, for use in the electronic subsystem.

In this embodiment, it becomes easier in a large digital signal processing system with several digital subsystems to newly assemble different subsystems as any subsystem may provide a clock signal for the other system. The clock duplication hardware may be identical in each subsystem. This allows the election of the clock driving subsystem during system configuration rather than during hardware development.

Other objects and features of the present invention will become apparent from the following detailed descriptions considered in conjunction with accompanying drawings. It is to be understood, however, that the drawings are designed totally for the purposes of illustration and not as a definition of the limits of the invention.

BRIEF DESCRIPTION OF THE DRAWINGS

In the diagrams and figures, like numbers refer to like objects throughout. Objects in the figures are not necessarily drawn to scale.

DETAILED DESCRIPTION OF EMBODIMENTS

Figure 2:
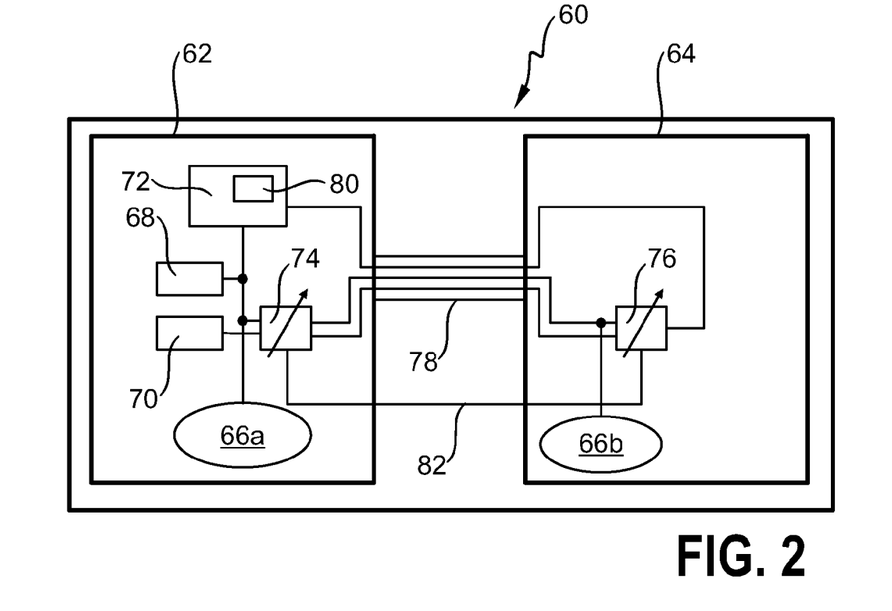
FIG. 2 shows an electronic system comprising two subsystems according to a first embodiment of the invention.

FIG. 2 shows an electronic system 60 comprising a first electronic subsystem 62 and a second electronic subsystem 64. The electronic subsystems 62 and 64 are distant from each other. They may be realized on individual circuit boards. The electronic system 60 may be a configurable digital signal processing system. Subsystems 62 and 64 comprise internal logic 66a, 66b, respectively. The internal logic 66a, 66b may comprise a plurality of integrated digital circuits, for example four FPGAs each. The integrated digital circuits need the same clock in this embodiment.

The electronic system 60 comprises a clock distributing system according to the invention. Subsystem 62 comprises a clock generator 68, a training signal generator 70, a measurement unit 72 and a first phase adjuster 74 as part of the clock distributing system. Subsystem 64 comprises a second phase adjuster 76 as part of the clock distributing system. A bidirectional signal path 78 couples the first subsystem 62 to the second subsystem 64. The bidirectional signal path 78 is adapted to transmit a clock signal and a training signal in both directions. The measurement unit 72 comprises a counter 80.

Clock generator 68 is coupled to internal logic 66a, to measurement unit 72 and to first phase adjuster 74. Training signal generator 70 is coupled to first phase adjuster 74. A clock output and a sync output of first phase adjuster 74 are coupled via bidirectional signal path 78 to a clock input respectively a sync input of second phase adjuster 76. The clock input of second phase adjuster 76 is further coupled to internal logic 66b. An output of second phase adjuster 76 is coupled via bidirectional signal path 78 to an input of measurement unit 72. First phase adjuster 74 and second phase adjuster 76 are interconnected via a line 82.

Operation of the clock distributing system in a learning period is now explained with reference to FIGS. 2 and 3.

Figure 3:
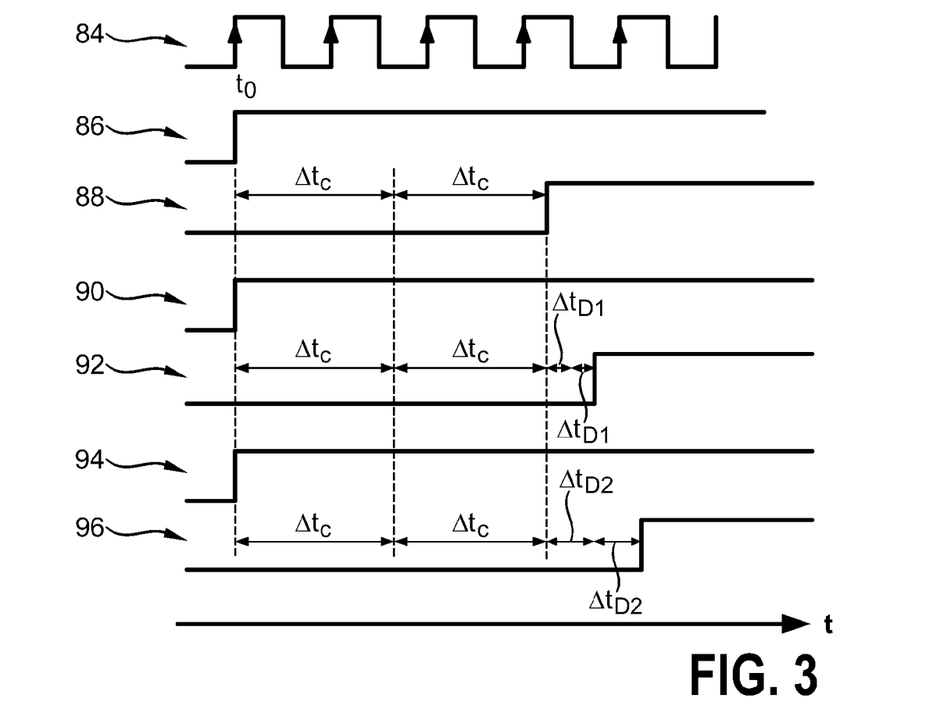
FIG. 3 shows a timing diagram of training signals during a learning period in the first embodiment.

FIG. 3 is a timing diagram of training signals. At a start of a learning period, first phase adjuster 74 and second phase adjuster 76 are set to a phase "0". Clock generator 68 generates a first clock signal 84. First clock signal 84 is fed to measurement unit 80. Training signal generator 70 generates a training signal 86 with a training pulse comprising a transition from a "low" state to a "high" state, i.e. a rising edge. The rising edge of training signal 86 is at a same time t0 as is a rising edge of clock signal 84. Training signal generator 70 is clocked by clock signal 84.

Generation of training signal 86 starts the counter 80 in measurement unit 72. Counter 80 counts the clock cycles of first clock signal 84 or more precisely the rising edges of clock signal 84. The training signal 86 passes the first phase adjuster 74 and the bidirectional signal path 78. In the second electronic subsystem 64, the training signal 86 passes the second phase adjuster 76 and is then fed back via the bidirectional signal path 78 to the first electronic subsystem 62. In the first subsystem 62, the delayed training signal which is represented in FIG. 3 as training signal 88 is input to measurement unit 72. The training signal 86 needs a first travel time Δtc to go to second subsystem 64 and a second travel time Δtc to go back to first subsystem 62. The training signal 88 arrives therefore at the measurement unit 72 at a time t=t0+2Δtc. Upon detection of the training signal 88 at the measurement unit 72, the counter 80 stops counting. As can be seen in FIG. 3, in the example shown, the time t is equal 3.25 clock cycles. The counter counts "3".

In a next step, the first phase adjuster 74 and the second phase adjuster 76 will change the phase of the training signal by adding a delay ΔtD1 each. It is to be understood, that the phase change may be in the other direction, virtually "subtracting" a time delay.

A new training signal 90 is generated and sent like the first training signal 86 to the second subsystem 64 and back to the first subsystem 62. As before, generation of the training signal starts the counter 80 in measurement unit 72. The delayed or returned training signal 92 arrives therefore at the measurement unit 72 at a time t=t0+2Δtc+2ΔtD1 as shown in FIG. 3. In this case, the total travel time is 3.75 clock cycles and the counter 80 will again count "3".

In a next step, the first phase adjuster 74 and the second phase adjuster 76 will change symmetrically the phase of the training signal by adding a further delay to a total delay of ΔtD2 each. A new training signal 94 is generated and sent like the first and the second training signals to the second subsystem 64 and back to the first subsystem 62. As before, generation of the new training signal 94 starts the counter 80 in measurement unit 72. The training signal 96 arrives therefore at the measurement unit 72 at a time t=t0+2Δtc+2ΔtD2 as shown in FIG. 3. In this case, the total travel time is 4.25 clock cycles and the counter 80 will count "4".

In an iterative process, the first and second phase adjusters may now decrease the phase delay to come near to the even number of 4 cycles in the present case. A method for deciding the best setting is now explained with reference to FIGS. 4A and 4B.

The best phase setting, i.e. the best phase delay ΔtDx is reached when the training signal changes simultaneously with the active clock edge. If the training signal was transmitted by the second subsystem on the rising clock edge (as shown in FIG. 3), the desired phase setting is reached if the returned training signal 88 changes with the rising edge of clock 84. Otherwise, if the training signal was transmitted on the falling clock edge (not shown in FIG. 3), the desired setting is reached if training signal 88 changes with the falling edge of clock 84. When sampling a signal exactly at the moment of its active edge, there is a statistical variation between sampling of the old value and sampling of the new value. This results in a variation in measurement of 2*N−1 clock cycles and 2*N clock cycles or, in other words, in a variation of a sampling error rate.

Figure 4A:
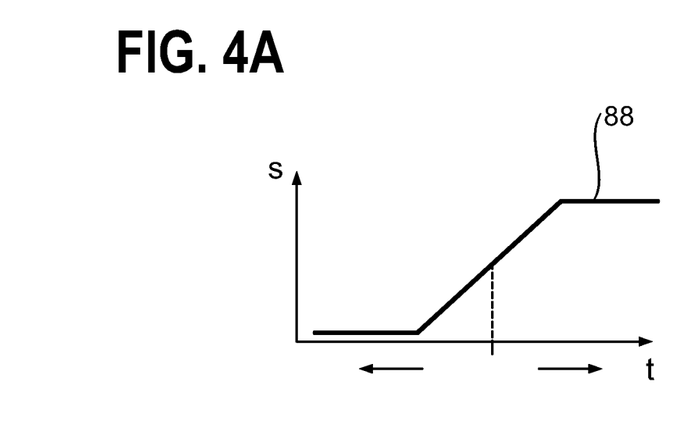
FIG. 4A shows in a diagram a signal level of a training signal over the delay time during the learning period.

FIG. 4A shows the signal level S of the training signal 88 over the time delay t. Increasing the PLL phase delay or phase offset in the phase adjusters 74, 76 increases the time delay, decreasing the PLL phase delay or phase offset decreases the time delay. As explained above, the training signal has two different signal levels: "low" and "high". With a smaller phase delay, i.e. in FIG. 4A on the left side, sampling gives a low value, whereas with an increased phase delay, i.e. in FIG. 4A on the right side, sampling gives a high value and the counter 80 increases its count by "1".

In the learning period, when determining the best delay setting, a number of training signals are sent in an iterative approach. For each sequence, the delay is changed to come to the best result. If the phase adjustment is such that the total delay t is away from an even number of clock cycles, i.e. the training signals are sampled away from the active edge, all successive sampling results are equal, for example "low". However, if the training signals are sampled near the active edge, the results vary between low and high value, there is a high variation.

Figure 4B:
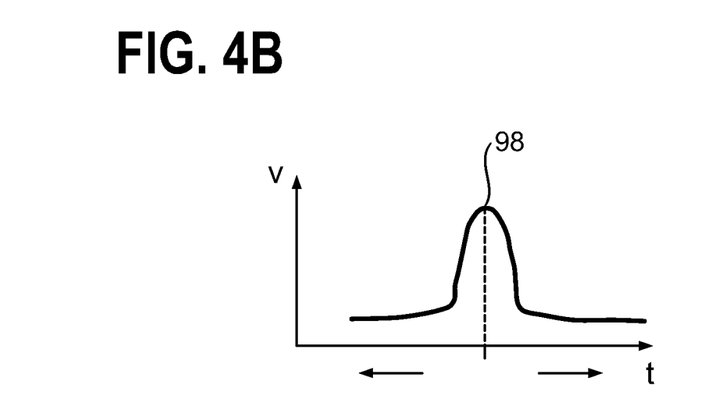
FIG. 4B shows in a diagram a variation of a number of cycles for a measured time needed over the delay time during the learning period.

FIG. 4B shows in a diagram the variation v of the sampling error rate over the time delay t. To the left on the time scale, always the same result is obtained, for example "low" and there is no variation. To the right on the time scale, again always the same result is obtained, for example "high" and there is no variation. In contrast, near the edge of the training signal, the variation is important and at 98 a maximum of variation is detected. This maximal variation is a criterion for determining the best phase adjustment. The variation value can be used to determine automatically the best setting of the phase delay. Once the best delay setting is determined, the learning period ends and a normal operation period start. During normal operation, first clock signal 84 can be distributed via the bidirectional signal path 78 from the first electronic subsystem 62 to the second electronic subsystem 64 and more specifically to the internal logic 66b. The first clock signal 84 is delayed by half of the delay of the returned training signal, i.e. by the phase delay added in first phase adjuster 74, because the first clock signal does not travel back. The delay of the first clock signal is an integral number of clock cycles, i.e. the same phase is obtained on the second subsystem as on the first subsystem.

Figure 5:
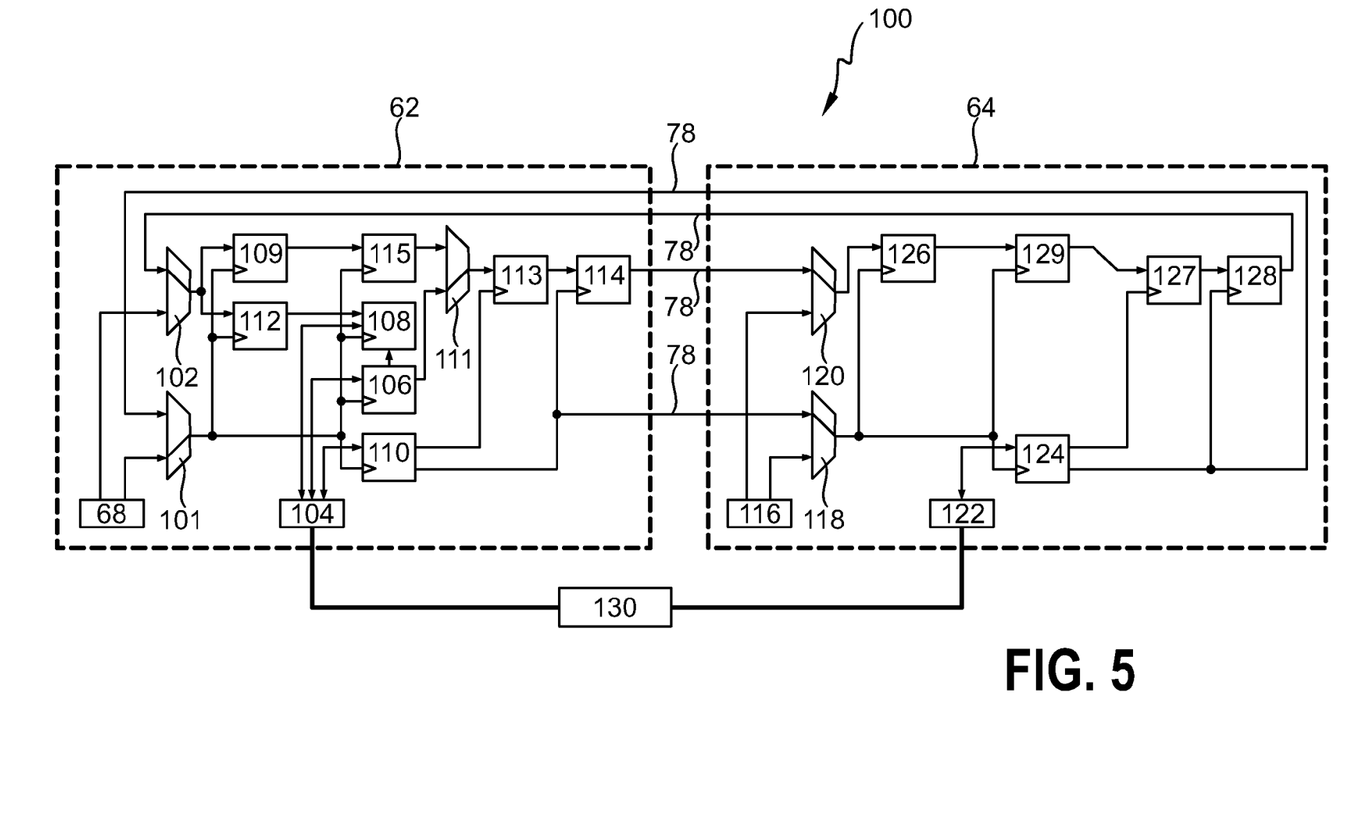
FIG. 5 shows an electronic system comprising two electronic subsystems according to a second embodiment of the invention.

FIG. 5 shows an exemplary implementation of an electronic system 100 with a clock distributing system according to the invention. The electronic system 100 comprises a first electronic subsystem or source system 62 and a second electronic subsystem or remote system 64. The first and the second subsystems are coupled to each other via a bidirectional signal path 78. A control unit 130 is coupled via control interfaces 104 and 122 to the first electronic subsystem 62 and the second electronic subsystem 64.

The first electronic subsystem 62 comprises a clock generator 68, a first switch 101, a second switch 102 and a third switch 111. For use during normal operation, clock generator 68 may be configured to generate also a reset signal or synchronization signal which can be sent in normal operation via the bidirectional signal path 78 instead of the training signal. The reset signal then passes a flip flop 109 and a flip flop 115. The first electronic subsystem 62 further comprises the control interface 104, a training signal generator 106, a phase detector 108, a phase locked loop 110 and three further flip flops 112, 113, and 114.

A first input of the first switch 101 is coupled to a clock output of clock generator 68. An output of the first switch 101 is coupled to a clock input of flip flop 112, to a clock input of flip flop 109, to a clock input of phase locked loop 110, to a clock input of sync signal generator 106, to a clock input of phase detector 108, and to a clock input of flip flop 115. An output of flip flop 109 is coupled to a data input of flip flop 115. A first input of the second switch 102 is coupled to a synchronization signal output or reset signal output of clock generator 68. An output of the second switch 102 is coupled to a data input of flip flop 112 and to a data input of flip flop 109. Control interface 104 is connected to the phase locked loop 110, to the sync signal generator 106 and to the phase detector 108. An output of flip flop 112 is coupled to a sync input of phase detector 108. A first clock output of phase locked loop 110 is coupled to a clock input of flip flop 113. A second clock output of phase locked loop 110 is coupled to a clock input of flip flop 114. First and second clock outputs may output clock signals with different phase delays. Training signal generator 106 is coupled with an output to phase detector 108. Training signal generator 106 is further coupled with a sync output to an input of flip flop 113.

Second electronic subsystem 64 comprises a clock generator 116, a fourth switch 118 and a fifth switch 120, a control interface 122, a phase locked loop 124 and four flip flops 126 to 129. Clock generator 116 is required if subsystem 64 runs in an autonomous mode with a clock signal independent from subsystem 62.

A first input of fourth switch 118 is coupled to a clock output of clock generator 116. A second input of fourth switch 118 is coupled via the signal path 78 to the second clock output of phase locked loop 110. An output of the fourth switch 118 is coupled to a clock input of phase locked loop 124 and to a clock input of flip flops 126 and 129. A first input of fifth switch 120 is coupled to a synchronization signal output or reset signal output of clock generator 116. A second input of fifth switch 120 is coupled via the signal path 78 to an output of flip flop 114. An output of the fifth switch 120 is coupled to an input of flip flop 126.

An output of flip flop 126 is coupled to an input of flip flop 129. An output of flip flop 129 is coupled to an input of flip flop 127. An output of flip flop 127 is coupled to an input of flip flop 128. A first clock output of phase locked loop 124 is coupled to a clock input of flip flop 127. A second clock output of phase locked loop 124 is coupled to a clock input of flip flop 128 and via the bidirectional signal path 78 to a second input of first switch 101. An output of flip flop 128 is coupled via the bidirectional signal path 78 to a second input of second switch 102. The control interface 122 is coupled to a phase input of phase locked loop 124. A control unit 130 is coupled to the interfaces 104 and 122. Control unit 130 may be an integral part of the electronic system 100 as well as a remote unit. Both subsystems 62, 64 further comprise internal logic which is not shown in FIG. 5. Functioning of the clock distributing system comprised in the electronic system 100 during a learning period will now be explained in detail with reference to FIGS. 5 and 6.

Clock and training signals are discussed at different points of the system at the end of a learning period. FIG. 5 shows switches 101, 102, 111, 118 and 120 in a position switched for the learning period. It is to be understood that in normal operation, switch 102 and switch 111 are switched to a position allowing a reset signal generated in clock generator 68 to be transmitted via the bidirectional signal path 78. In normal operation mode, no training signal is generated in training signal generator 106 and accordingly no training signal is fed back via switch 102.

Figure 6:
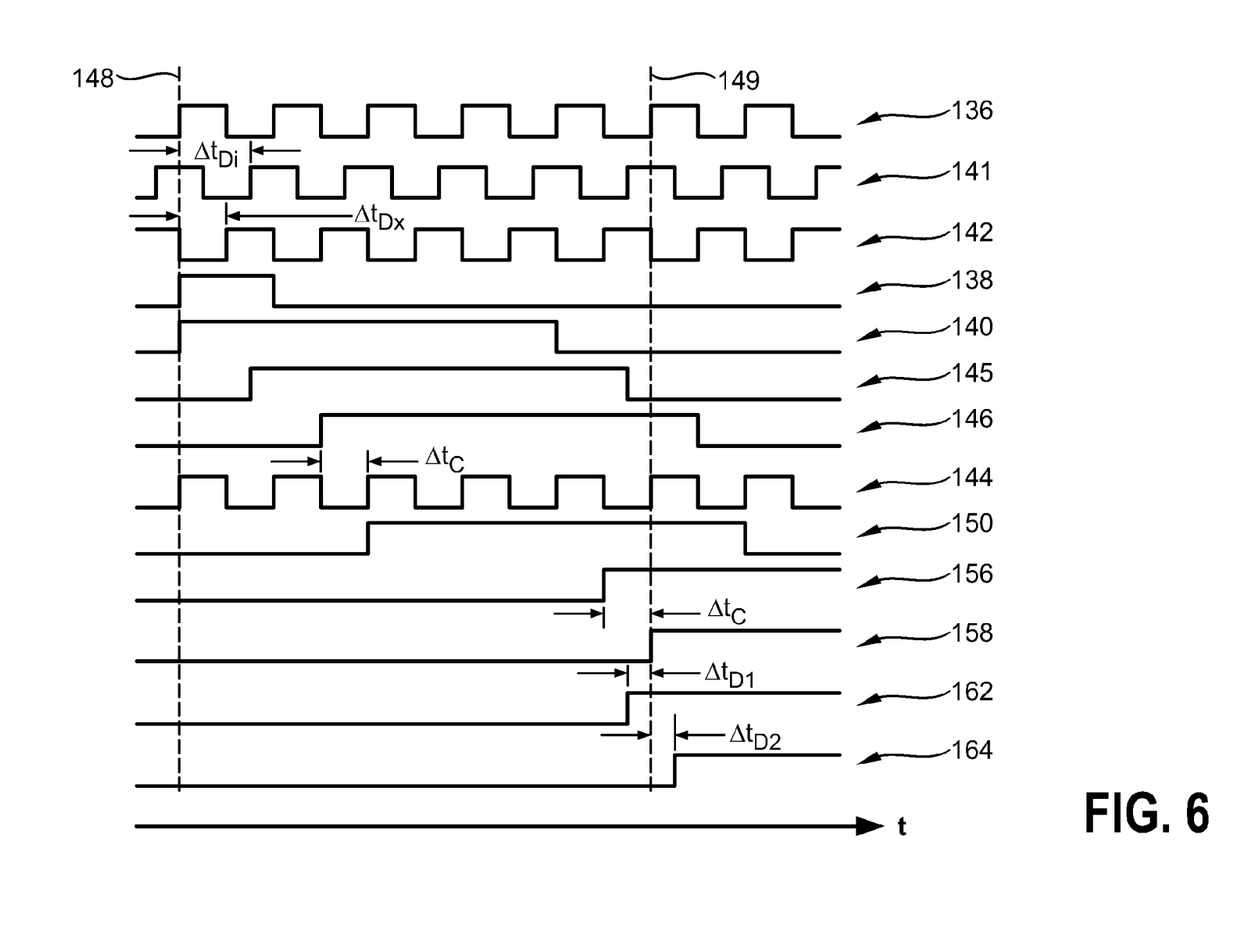
FIG. 6 shows a timing diagram of clock signals and training signals at different locations of the electronic system of FIG. 2 at the end of the learning period.

FIG. 6 shows in a line 136 the chronological sequence of a first clock signal as generated by clock generator 68 and input to the first switch 101. Due to the position of switch 101 as shown in FIG. 5, the clock signal 136 is fed to a clock input of flip flop 112, to a clock input of phase locked loop 110, to a clock input of training signal generator 106, and to a clock input of phase detector 108. The clock signal 136 has a defined frequency and a defined phase.

Training signal generator 106 generates a start pulse as indicated in a line 138 in FIG. 6, which is input to phase detector 108. Training signal generator 106 further generates a training signal, as shown in a line 140 in FIG. 6. Training signal generator 106 is clocked with the clock signal 136 so that the training signal 140 is generated in phase with clock signal 136. Training signal 140 is input to flip flop 113, whose output is input to flip flop 114.

Phase detector 108 corresponds to the measurement unit 72 in FIG. 2. Phase detector 108 comprises a counter (not shown in FIG. 2) and communicates via control interface 104 with the control unit 130. Upon reception of the start pulse, phase detector 108 starts measuring the round trip time for the training signal.

First clock output of PLL 110 outputs a clock signal with an intermediate phase shift •tDi to flip flop 113 as shown in line 141. Second clock output of PLL 110 outputs a clock signal with a phase shift •tDx to flip flop 114 as shown in line 142. The training signal output from training signal generator 106 is thus clocked first in flip flop 113 with the intermediate phase shift •tDi and then in the flip flop 114 with the phase shift •tDx. The intermediate phase shift •tDi ensures that the training signal generated by training signal generator 106 has at least half a clock cycle to pass to the next clock cycle to ensure an error free processing. In an embodiment, the intermediate phase shift can be calculated as half of the clock period plus half of the current phase shift: •tDi=½ tclk+½•tDx.

At the end of the learning period, i.e. after adjustment of the phase, the second output of PLL 110 has a phase delay ΔtDx compared to the input clock 136. Training signal 140 is first delayed by •tDi at the output of flip flop 113, which is shown in a line 145. Signal 145 arrives at the output of flip flop 114 with a total delay of one clock period plus •tDx against training signal 140, which is shown in a line 146. Clock signal 142 and training signal 146 are transmitted together as a master beat signal via bidirectional signal path 78 to second subsystem 64.

Due to the travel time Δtc on the bidirectional signal path 78 between first subsystem 62 and second subsystem 64, a clock signal 144 at fourth switch 118 and a training signal 150 at fifth switch 120 are further delayed. The phase delay ΔtDx of clock signal 142 added to the travel time or connection delay Δtc results in a clock signal 144 which is in phase with clock signal 136 as indicated by a line 148 in FIG. 6. During normal operation, clock signal 144 is used in second subsystem 64 for the internal logic, whereas clock signal 136 is used for the internal logic in first subsystem 62.

To ensure correct transmission of training signal 150, subsystem 64 performs the following sequence of operations. Flip flop 126 samples training signal 150 at the falling edge of clock signal 144. This is the best sampling position, since the training signal was transmitted at the rising clock edge at flip flop 114. The training signal is thus sampled in the second subsystem with the opposite edge of the clock compared to the first subsystem. Flip flop 129 samples the output of flip flop 126 at the rising edge of clock signal 144.

Clock signal 144 is input to the phase locked loop 124 where it is delayed by the same phase delay Δt0x as in the PLL 110. The same phase delay Δt0x in both PLLs 110, 124 is assured by the control unit 130 which transmits an information about the needed delay digitally between the two subsystems. PLL 124 outputs therefore a clock signal which is delayed by Δt0x in relation to clock signal 144.

Flip flops 127 and 128 of subsystem 64 correspond to flip flops 113 and 114 of subsystem 62 and are clocked by the clock signals output of PLL 124. Flip flop 127 is driven by an intermediate clock shifted by •tDi, which is output by the first output of PLL 124. Flip flop 128 is driven by the clock from the second output of PLL 124 with a phase shift of •tDx. The output of flip flop 128 is shown in line 156. The total delay against the incoming clock 144 is two clock periods plus phase delay, 2*tclk+•tDx.

The training signal 156 is fed back to first subsystem 62 via bidirectional signal path 78 to second switch 102. In the feedback loop the training signal needs the same travel time Δtc and arrives at first subsystem 62 as training signal 158. Training signal 158 is clocked in flip flop 112 with the clock signal 136 generated by clock generator 68 and fed to phase detector 108. Upon detection of the rising edge of the fed back training signal, the counter in phase detector 108 stops counting. Phase detector 108 communicates the measurement result to control unit 130 which controls the phase adjusters 110 and 124 accordingly symmetrically. Training signal 158 is clocked with the rising edge of clock signal 136. As phase delay ΔtDx is adjusted correctly at the end of the learning period, the rising edge of training signal 158 is in line with the rising edge of clock signal 136 as indicated by the vertical line 149.

During the learning period the phase is shifted in an iterative approach which is illustrated in FIG. 6 by lines 162 and 164 showing training signals which are not yet correctly shifted. In a line 162 in FIG. 6 is shown a training signal which has been delayed by a smaller time delay ΔtD1 than the necessary delay •tDx, i.e. which is not adjusted correctly. The rising edge of training signal 162 is chronologically before the rising edge of clock signal 160, therefore, the training signal 162 is too fast. In a line 164 a training signal is shown at sync input 94 which has been delayed by a too great time delay ΔtD2. The rising edge of training signal 164 lies chronologically after the rising edge of clock signal 160.

When the learning period is terminated, i.e. when the time the training signal needs for a round trip is set to an even number of clock cycles, normal operation can start. Therefore, switches 102 and 111 are switched and training signal generator 106 is not active anymore. The first clock signal generated by clock generator 68 is sent via the bidirectional signal path 78 to the subsystem 64 and used by the internal logic there. As the round trip time is an even number of clock cycles, the way for the first clock signal to go to the second electronic subsystem 64 is an integer number of clock cycles and the clock signals on both subsystems are in phase. The bidirectional signal path 78 may further be used by a reset signal generated in the clock generator 68, i.e. for transmitting system synchronization events.

The inventive apparatus and method can be extended to duplicate the clock signal not only from subsystem 62 to subsystem 64, but also into the opposite direction. Subsystem 64 comprises a clock generator 116 which may be used as source clock which is distributed to subsystem 62. Clock generator 116 may also be used as a local clock source. An apparatus with run-time reconfigurable direction of clock distribution, i.e. which may inverse source and target subsystem during operation, uses the high degree of similarities of subsystems 62 and 64, using a clock generator 68/116, a first multiplexer 101/118, a second multiplexer 102/120, an input flip flop 112 running on the rising clock edge and connected to phase detector 108 which is used if the apparatus is in the clock source subsystem, an input flip flop 109/126 running on the falling clock edge and connected to a flip flop 115/129 which is used if the apparatus is in the clock target subsystem. In other words, a clock distribution system with reconfigurable direction of clock distribution needs a flip flop 109/126 and a flip flop 112 in each subsystem. To change the electronic system 100 shown in FIG. 5 into an apparatus with run-time reconfigurable direction of clock distribution a further supplementary training signal generator 106 must be provided in second electronic subsystem 64.

Instead of adding separate flip flops 112 respectively 109/126, flip flops 112 and 109/126 can be combined into a double data rate flip flop which acts on both clock edges, i.e. flip flops 112 and 109 in system 100 would be implemented as a double data rate flip flop. The multiplexer 111 selects between the output of the training signal generator 106 and the sync flip flop 115. The setting of the multiplexer 111 determines if the subsystem acts as clock source or clock target.

Further, the invention is not limited to an electronic system comprising only two subsystems with one subsystem 62 used as source system and the other system, the subsystem 64, used as a remote system. The inventive apparatus can be duplicated to copy the same clock signal from one central source subsystem to several other target subsystems with direct connection 78 to the central subsystem, forming a star topology. The apparatus can also be used to duplicate an already duplicated clock signal from a receiving subsystem to another receiving subsystem, forming a chain topology. Both topologies can also be combined.

Figure 7:
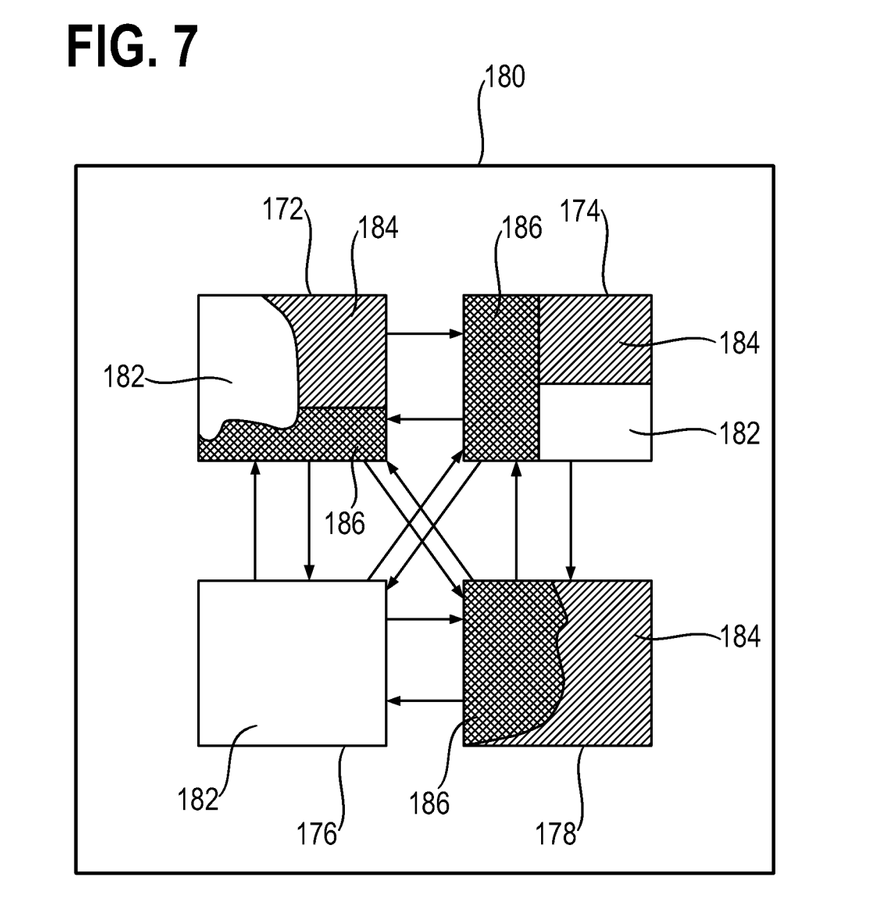
FIG. 7 shows an exemplary distribution of clock domains over four subsystems.

FIG. 7 shows an exemplary electronic system 180 comprising 4 subsystems 172, 174, 176 and 178. The electronic system 180 comprises three different clock domains 182, 184 and 186. Logically, the clock domains 182, 184 and 186 each form a logic partition. Physically, however, the clock domains 182, 184 and 186 are distributed over the different subsystems 172, 174, 176 and 178 which may be different circuit boards. In the embodiment shown in FIG. 7, subsystem 176 comprises only one clock domain 182. Subsystems 172 and 174 comprise all three clock domains 182, 184 and 186. Subsystem 178 comprises two clock domains 184 and 186. Arrows between the different subsystems indicate data transfer and possibly clock transfer between these subsystems. Subsystem 176 may comprise a clock generator generating the clock of clock domain 182 and using a first clock distributing system according to the invention for transmitting the clock to subsystem 172, and a second clock distributing system distributing the clock to subsystem 174. This is a star configuration or star topology. In a learning period, a delay must be determined for each clock distributing system.

It is also possible that subsystem 176 distributes the clock only to subsystem 172 using the first clock distributing system. Then, subsystem 172 may use a third clock distributing system to distribute the clock received from subsystem 176 to subsystem 174. This is a chain configuration or chain topology. The phase relation achieved with the inventive system is sufficiently exact for allowing a further distributing or a hop to another system. In a learning period, a delay must be determined for the third clock distributing system.

Subsystem 178 may comprise two clock generators, one for the clock of clock domain 184 and one for generating the clock of clock domain 186. Subsystem 178 may then distribute the two clocks according to the invention with separate clock distribution systems to subsystems 172 and 174. In a learning period, a delay must be determined for each clock distributing system.

Thus, the invention is well suited for configurable digital systems which comprise two or more subsystems. A clock duplication or distributing process is performed for each subsystem in the connection separately.

Figure 8:
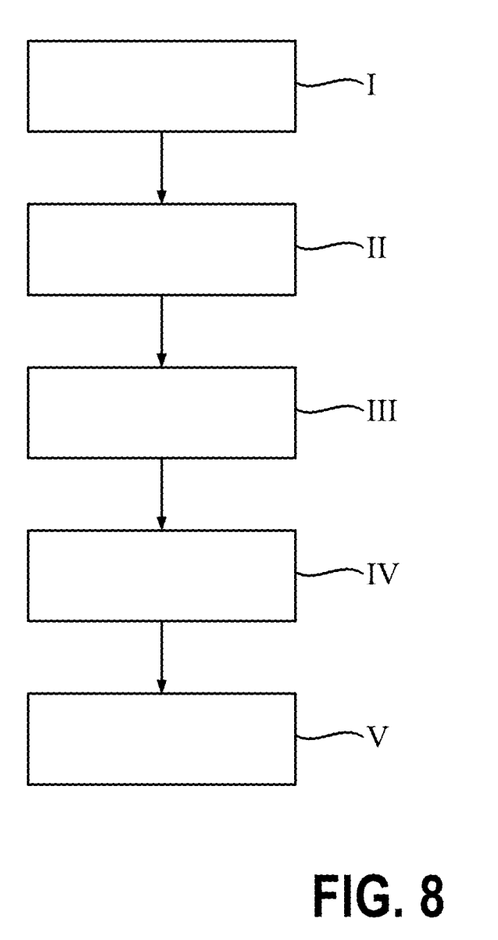
FIG. 8 shows steps of the inventive method in a flow diagram.

FIG. 8 summarizes in a flow diagram the steps of the inventive method. In a learning period, in a first step I, a training signal is generated on a first electronic subsystem which can be seen as a source system. In a second step II, the training signal is sent on a bidirectional signal path to a second electronic subsystem which is a remote system. The training signal is sent back on the bidirectional signal path to the first electronic system, whereby the training signal is delayed.

In a third step III, the time the training signal needs for a round trip, i.e. to go to the remote second electronic subsystem and back to the first electronic subsystem is measured. In a fourth step IV, a phase of the training signal is adjusted until the measured time is equal to an even number of clock cycles. In a fifth step V, normal operation is assumed maintaining the phase adjustment set during the learning period for the clock signal.

Although the present invention has been disclosed in the form of preferred embodiments and variations thereon, it will be understood that additional modifications and variations could be made thereto without departing from the scope of the invention.

For the sake of clarity, it is to be understood that the use of "a" or "an" throughout this application does not exclude plurality, and "comprising" does not exclude other steps or elements.

The invention claimed is:

1. A method of distributing a clock signal from a first electronic subsystem to a second electronic subsystem, said second electronic subsystem being remote from said first electronic subsystem and coupled to said first electronic subsystem by a bidirectional signal path, the method comprising a learning period prior to normal operation with the following steps:
generating a first clock signal on said first electronic subsystem;
generating a training signal on said first electronic subsystem clocked by said first clock signal;
sending said training signal on said bidirectional signal path on a round trip to said second electronic subsystem and back to said first electronic subsystem:
measuring a time said training signal needs for said round trip; and
in response to the measured time, adjusting by a phase delay a phase of said training signal on the way to said second electronic subsystem in a first phase adjuster of the first electronic subsystem and adjusting by the same phase delay a phase of said training signal on the way back to said first electronic subsystem in a second phase adjuster of the second electronic subsystem so that said time needed for said round trip is equal to an even number of clock cycles of the first clock signal.

2. The method according to claim 1, said learning period further comprising:
sending a sequence of a plurality of training signals on said bidirectional signal path to said second electronic subsystem and back to said first electronic subsystem;
adjusting the phase iteratively until some of said training signals out of said sequence of training signals have a travel time of 2*N cycles (N being an integer) and some of the training signals have a travel time of 2*N−1 cycles for said round trip.

3. The method according to claim 2, said learning period further comprising:
analyzing a statistical variation between a travel time of 2*N cycles and of 2*N−1 cycles, and
setting the phase delay to have a maximal statistical variation.

4. The method according to claim 1, said learning period further comprising:
transmitting said first clock signal parallel to said training signal on said bidirectional signal path to said second electronic subsystem; and
using said transmitted first clock signal in said second electronic subsystem to sample said training signal in said second electronic subsystem.

5. The method according to claim 1, further comprising:
transmitting digitally an information about an amount of phase adjustment between said first and said second phase adjuster.

6. The method according to claim 1, further comprising:
sampling said returned training signal in said first electronic subsystem using a same edge of said first clock signal as used when generating said training signal.

7. The method according to claim 1, further comprising:
using said bidirectional signal path during normal operation for transmitting a synchronization signal associated to said first clock signal to broadcast system synchronization events.

8. The method according to claim 1, further comprising:
generating a second clock signal on said second electronic subsystem; and
distributing via said bidirectional signal path at least one out of said first clock signal and said second clock signal to said second electronic subsystem respectively to said first electronic subsystem during normal operation, wherein a phase adjustment in said first phase adjuster adjusts the phase of said first clock signal and a phase adjustment in said second phase adjuster adjusts the phase of said second clock signal.

9. A clock distributing system comprising:
a clock generator located in a first electronic subsystem for generating a first clock signal;
a training signal generator located in said first electronic subsystem for generating a training signal clocked by said first clock signal in a learning period setting prior to normal operation;
a bidirectional signal path adapted to transmit said first clock signal and said training signal between said first electronic subsystem and a remote second electronic subsystem;
a measurement unit adapted to measure a time needed for said training signal to go to said remote second electronic subsystem and back to said first electronic subsystem in a round trip; and
a first phase adjuster of the first electronic subsystem and a second phase adjuster of the second electronic subsystem, wherein the first phase adjuster is configured to adjust by a phase delay a phase of said training signal on the way to said second electronic subsystem in response to the measured time and the second phase adjuster is configured to adjust by the same phase delay a phase of said training signal on the way back to said first electronic subsystem in response to the measured time so that the time needed for said round trip is equal to an even number of clock cycles of the first clock signal, the first phase adjuster and the second phase adjuster being further configured to maintain the adjusted phase during the normal operation.

10. The clock distributing system according to claim 9, wherein
said measurement unit comprises a counter adapted to count a number of clock cycles, the count starting with the generation of said training signal and ending when the returned back training signal is detected.

11. The clock distributing system according to claim 10, further comprising:
a control unit adapted to control said first phase adjuster and said second phase adjuster symmetrically.

12. An electronic system comprising two electronic subsystems and a clock distributing system according to claim 9.

13. The electronic system of claim 12, comprising two clock distributing systems according to claim 9, wherein, each one of said two electronic subsystems can function as a source system with a clock generator distributing a clock to the other one of said two electronic subsystems, each electronic subsystem comprising a switch for selecting one out of the two clocks for use on the electronic subsystem.

14. The electronic system of claim 12 comprising a plurality of clock distributing systems configured to distribute a clock using a star topology or a chain topology.

15. The clock distributing system according to claim 9, further comprising a switch to change between the learning period setting and a normal operation setting.

* * * * *